US007164281B2

(12) United States Patent
Kou

(10) Patent No.: US 7,164,281 B2
(45) Date of Patent: Jan. 16, 2007

(54) CIRCUIT BOARD COMPONENT AMBIENT MOISTURE EXPOSURE MONITORING

(75) Inventor: Yuen-Foo Michael Kou, Andover, MA (US)

(73) Assignee: Accu-Assembly Incorporated, Andover, MA (US)

( * ) Notice: Subject to any disclaimer, the term of this patent is extended or adjusted under 35 U.S.C. 154(b) by 0 days.

(21) Appl. No.: 10/783,846

(22) Filed: Feb. 20, 2004

(65) Prior Publication Data

US 2005/0184723 A1    Aug. 25, 2005

(51) Int. Cl.
*G01R 31/02*    (2006.01)
(52) U.S. Cl. ...................................... 324/763
(58) Field of Classification Search ................ 324/112, 324/113, 102, 73, 760, 763; 702/101, 130; 360/133; 374/28, 45
See application file for complete search history.

(56) References Cited

U.S. PATENT DOCUMENTS

| | | | | |
|---|---|---|---|---|
| 4,165,633 A | * | 8/1979 | Raisanen | 73/76 |
| 4,242,632 A | | 12/1980 | Irvin | |
| 4,298,946 A | * | 11/1981 | Hartsell et al. | 700/278 |
| 4,426,619 A | | 1/1984 | Demand | |
| 4,684,884 A | | 8/1987 | Soderlund | |
| 4,728,885 A | | 3/1988 | DeSanto | |
| 4,922,433 A | * | 5/1990 | Mark | 73/73 |
| 4,939,469 A | | 7/1990 | Ludwig et al. | |
| 5,024,532 A | | 6/1991 | Rall | |
| 5,434,737 A | | 7/1995 | Miura | |
| 5,450,018 A | | 9/1995 | Rieser et al. | |
| 5,606,264 A | | 2/1997 | Licari et al. | |
| 5,682,684 A | * | 11/1997 | Wentzlaff et al. | 34/495 |
| 5,716,272 A | * | 2/1998 | Nelson | 460/7 |
| 5,764,073 A | | 6/1998 | Sadamatsu | |
| 5,867,809 A | | 2/1999 | Soga et al. | |
| 6,002,650 A | * | 12/1999 | Kuribayashi et al. | 700/117 |
| 6,055,008 A | * | 4/2000 | Bliss | 347/133 |
| 6,113,262 A | | 9/2000 | Purola et al. | |
| 6,560,839 B1 | * | 5/2003 | Tow | 29/407.01 |
| 6,759,862 B1 | * | 7/2004 | Kou | 324/763 |
| 6,778,878 B1 | * | 8/2004 | Kou | 700/221 |

(Continued)

FOREIGN PATENT DOCUMENTS

JP        61-068514      4/1986

(Continued)

OTHER PUBLICATIONS

"Cytherm Temperature Data Logger Key", Dynasys Technologies Inc., Spring 2000.

(Continued)

*Primary Examiner*—Jermele Hollington
(74) *Attorney, Agent, or Firm*—Fish & Richardson P.C.

(57) ABSTRACT

A method of assembling multiple electronic components to a circuit board includes securing one electronic component to the circuit board, then, creating an association between that electronic component and an environmental condition recorder. The method further includes recording data from the environmental condition recorder. The recorded data indicates exposure of the secured electronic component to an environmental condition over time. The method also includes determining, based on the stored data, whether the secured electronic component is suitable for exposure to conditions associated with securing a second electronic component to the circuit board.

37 Claims, 6 Drawing Sheets

U.S. PATENT DOCUMENTS

| | | | |
|---|---|---|---|
| 6,879,869 B1* | 4/2005 | Kou | 700/117 |
| 7,015,713 B1* | 3/2006 | Kou | 324/763 |
| 2003/0030429 A1* | 2/2003 | Kou | 324/158.1 |
| 2003/0102367 A1 | 6/2003 | Monette et al. | |
| 2004/0193302 A1* | 9/2004 | Kou | 700/114 |
| 2004/0239360 A1* | 12/2004 | Kou | 324/763 |
| 2005/0179562 A1* | 8/2005 | Ganz et al. | 340/870.07 |

FOREIGN PATENT DOCUMENTS

| | | |
|---|---|---|
| JP | 06042986 | 2/1994 |
| JP | 11125543 A * | 5/1999 |

OTHER PUBLICATIONS

"DALLAS Semiconductor, DS2438 Smart Battery Monitor", www.dalsemi.com, Apr. 10, 2001, pp 1-29.
"Humidity Sensors Relative Humidity", Honeywell HIH Series, pp. 99, 100., 2000.
"Joint Industry Standard", IPC/JEDEC J-STD-033, Apr. 1999.
"Microchip PIC12C67X", © 1999 Microchip Technology Inc.
Awtrey et al., "A1-Wire Humidity Sensor", Sensors The Journal of Applied Sensing Technology, Aug. 2000.

* cited by examiner

IPC/JEDEC J-STD-033A                                                                                                              July 2002

Table 7-1  Recommended Equivalent Total Floor Life (days) @ 20°C, 25°C & 30°C
For ICs with Novolac, Biphenyl and Multifunctional Epoxies
(Reflow at same temperature at which the component was classified)

| Package Type and Body Thickness | Moisture Sensitivity Level | Maximum Percent Relative Humidity | | | | | | | | | |
|---|---|---|---|---|---|---|---|---|---|---|---|
| | | 5% | 10% | 20% | 30% | 40% | 50% | 60% | 70% | 80% | 90% | |
| Body Thickness ≥3.1 mm including PQFPs >84 pins, PLCCs (square) All MQFPs or All BGAs ≥1 mm | Level 2a | ∞ | ∞ | ∞ | 60 | 41 | 33 | 28 | 10 | 7 | 6 | 30°C |
| | | ∞ | ∞ | ∞ | 78 | 53 | 42 | 36 | 14 | 10 | 8 | 25°C |
| | | ∞ | ∞ | ∞ | 103 | 69 | 57 | 47 | 19 | 13 | 10 | 20°C |
| | Level 3 | ∞ | ∞ | 10 | 9 | 8 | 7 | 7 | 5 | 4 | 4 | 30°C |
| | | ∞ | ∞ | 13 | 11 | 10 | 9 | 9 | 7 | 6 | 5 | 25°C |
| | | ∞ | ∞ | 17 | 14 | 13 | 12 | 12 | 10 | 8 | 7 | 20°C |
| | Level 4 | ∞ | 5 | 4 | 4 | 4 | 3 | 3 | 3 | 2 | 2 | 30°C |
| | | ∞ | 6 | 5 | 5 | 5 | 5 | 4 | 3 | 3 | 3 | 25°C |
| | | ∞ | 8 | 7 | 7 | 7 | 7 | 6 | 5 | 4 | 4 | 20°C |
| | Level 5 | ∞ | 4 | 3 | 3 | 2 | 2 | 2 | 2 | 1 | 1 | 30°C |
| | | ∞ | 5 | 5 | 4 | 4 | 3 | 3 | 2 | 2 | 2 | 25°C |
| | | ∞ | 7 | 7 | 6 | 5 | 5 | 4 | 3 | 3 | 3 | 20°C |
| | Level 5a | ∞ | 2 | 1 | 1 | 1 | 1 | 1 | 1 | 1 | 1 | 30°C |
| | | ∞ | 3 | 2 | 2 | 2 | 2 | 2 | 1 | 1 | 1 | 25°C |
| | | ∞ | 5 | 4 | 3 | 3 | 3 | 3 | 2 | 2 | 2 | 20°C |
| Body 2.1 mm ≤ Thickness <3.1 mm including PLCCs (rectangular) 18-32 pins SOICs (wide body) SOICs ≥20 pins, PQFPs ≤80 pins | Level 2a | ∞ | ∞ | ∞ | ∞ | 86 | 39 | 28 | 4 | 3 | 2 | 30°C |
| | | ∞ | ∞ | ∞ | ∞ | 148 | 51 | 37 | 6 | 4 | 3 | 25°C |
| | | ∞ | ∞ | ∞ | ∞ | ∞ | 69 | 49 | 8 | 5 | 4 | 20°C |
| | Level 3 | ∞ | ∞ | 19 | 12 | 9 | 8 | 7 | 3 | 2 | 2 | 30°C |
| | | ∞ | ∞ | 25 | 15 | 12 | 10 | 9 | 5 | 3 | 3 | 25°C |
| | | ∞ | ∞ | 32 | 19 | 15 | 13 | 12 | 7 | 5 | 4 | 20°C |
| | Level 4 | ∞ | 7 | 5 | 4 | 4 | 3 | 3 | 2 | 2 | 1 | 30°C |
| | | ∞ | 9 | 7 | 5 | 5 | 4 | 4 | 3 | 2 | 2 | 25°C |
| | | ∞ | 11 | 9 | 7 | 6 | 6 | 5 | 4 | 3 | 3 | 20°C |
| | Level 5 | ∞ | 4 | 3 | 3 | 2 | 2 | 2 | 1 | 1 | 1 | 30°C |
| | | ∞ | 5 | 4 | 3 | 3 | 3 | 3 | 2 | 1 | 1 | 25°C |
| | | ∞ | 6 | 5 | 5 | 4 | 4 | 4 | 3 | 3 | 2 | 20°C |
| | Level 5a | ∞ | 2 | 1 | 1 | 1 | 1 | 1 | 1 | 0.5 | 0.5 | 30°C |
| | | ∞ | 2 | 2 | 2 | 2 | 2 | 2 | 1 | 1 | 1 | 25°C |
| | | ∞ | 3 | 2 | 2 | 2 | 2 | 2 | 2 | 2 | 1 | 20°C |
| Body Thickness <2.1 mm including SOICs <18 pins All TQFPs, TSOPs or all BGAs <1 mm body thickness | Level 2a | ∞ | ∞ | ∞ | ∞ | ∞ | ∞ | 28 | 1 | 1 | 1 | 30°C |
| | | ∞ | ∞ | ∞ | ∞ | ∞ | ∞ | ∞ | 2 | 1 | 1 | 25°C |
| | | ∞ | ∞ | ∞ | ∞ | ∞ | ∞ | ∞ | 2 | 2 | 1 | 20°C |
| | Level 3 | ∞ | ∞ | ∞ | ∞ | ∞ | 11 | 7 | 1 | 1 | 1 | 30°C |
| | | ∞ | ∞ | ∞ | ∞ | ∞ | 14 | 10 | 2 | 1 | 1 | 25°C |
| | | ∞ | ∞ | ∞ | ∞ | ∞ | 20 | 13 | 2 | 2 | 1 | 20°C |
| | Level 4 | ∞ | ∞ | ∞ | 9 | 5 | 4 | 3 | 1 | 1 | 1 | 30°C |
| | | ∞ | ∞ | ∞ | 12 | 7 | 5 | 4 | 2 | 1 | 1 | 25°C |
| | | ∞ | ∞ | ∞ | 17 | 9 | 7 | 6 | 2 | 2 | 1 | 20°C |
| | Level 5 | ∞ | ∞ | 13 | 5 | 3 | 2 | 2 | 1 | 1 | 1 | 30°C |
| | | ∞ | ∞ | 18 | 6 | 4 | 3 | 3 | 2 | 1 | 1 | 25°C |
| | | ∞ | ∞ | 26 | 8 | 6 | 5 | 4 | 2 | 2 | 1 | 20°C |
| | Level 5a | ∞ | 10 | 3 | 2 | 1 | 1 | 1 | 1 | 1 | 0.5 | 30°C |
| | | ∞ | 13 | 5 | 3 | 2 | 2 | 2 | 1 | 1 | 1 | 25°C |
| | | ∞ | 18 | 6 | 4 | 3 | 2 | 2 | 2 | 2 | 1 | 20°C |

∞ Represents indefinite exposure time allowed at conditions specified.

PRIOR ART
FIG. 4

CIRCUIT BOARD COMPONENT AMBIENT MOISTURE EXPOSURE MONITORING

BACKGROUND

This invention relates to monitoring electronic components secured to a circuit board, and more particularly to monitoring the effects of moisture exposure associated with those components.

Reflow soldering is a manufacturing process used to secure electronic components to a circuit board. In particular instances, several electronic components may be secured to the same circuit board by performing several sequential reflow soldering processes on the same circuit board. As an example, a first electronic component may be reflow soldered to a circuit board. Then, some time later, a second electronic component may be reflow soldered to the same circuit board. During the later reflow soldering process, the first electronic component may be exposed to elevated temperatures. This elevated temperature can cause any trapped moisture within the body of the first electronic component to expand rapidly, and thereby damage the electronic component. Such damage may, of course, become immediately apparent. However, in certain instances, the damage may remain undetected until the circuit board containing the damaged component has been installed into some end product.

SUMMARY OF THE INVENTION

One aspect of the invention features an improved method for securing multiple electronic components to a circuit board. The method includes securing a first electronic component to the circuit board. The method also includes creating an association between the secured electronic component and an environmental condition recorder. Data is then automatically and electronically recorded by the environmental condition recorder. The data indicates exposure of the secured electronic component to an environmental condition over time. The method also includes using the environmental condition recorder to determine, based on the recorded data, whether the secured electronic component is suitable for exposure to conditions associated with securing a second electronic component to the same circuit board.

According to one implementation, if a secured electronic component is found suitable for exposure to conditions associated with securing a second electronic component to the circuit board, the method includes exposing the suitable secured electronic component to such conditions.

Another aspect of the invention features a method of securing multiple sets of electronic components to a circuit board. This method includes reflow soldering a first set of electronic components to the circuit board. The method also includes creating an association between the first set of electronic components and an environmental condition recorder. The method further includes collecting environmental exposure data associated with this first set of electronic components during consecutive time periods before reflow soldering a second set of electronic components to the same circuit board. The collected data is stored within the environmental condition recorder. Moreover, the method includes estimating a cumulative effect of the environmental exposure on each electronic component of the first set, based on the stored data. Additionally, the method includes evaluating whether each electronic component of the first set is suitable for exposure to environmental conditions associated with reflow soldering the second set of electronic components to the same circuit board.

In one implementation, the method includes reflow soldering the second set of electronic components to the circuit board as long as each electronic component of the first set is found suitable for exposure to environmental conditions associated with reflow soldering the second set of electronic components to the circuit board.

In some implementations one or more of the following advantages may be present. Most significantly, the possibility of producing circuit boards having compromised electronic components secured thereon may be reduced. Particularly, the method and techniques discussed herein may provide assurance that each set of electronic components, previously attached to a circuit board, has not been exposed to potentially undesirable environmental conditions, such as excessive atmospheric moisture content, which might render the components susceptible to being damaged during conditions associated with reflow soldering a subsequent set of electronic components to the same circuit board.

Additionally, manpower required to monitor the effects of moisture exposure on circuit board components may be drastically reduced. Moreover, the process of predicting electronic component failure may be simplified. Also, the accuracy of making such predictions may be dramatically improved, since the possibility of "human error" can be minimized.

The methods and techniques disclosed herein may result in improved reliability of electronic components, the circuit boards those components are installed in, and the machines which ultimately house such circuit boards.

The amount of moisture exposure data that is collected may be increased. This may enable a manufacture to make more effective and meaningful decisions regarding whether to dry out electronic components prior to reflow soldering processes. Typically, such drying is accomplished by baking the electronic components. As a result of the techniques and methods discussed herein, the frequency of unnecessary baking may be decreased.

Other features and advantages will be readily apparent from the following detailed description, the accompanying drawings and the claims.

BRIEF DESCRIPTION OF THE DRAWINGS

FIG. 4 is a prior art table listing recommended equivalent total floor life data.

Like reference symbols in the various drawings indicate like elements.

DETAILED DESCRIPTION OF THE DRAWINGS

Figure 1:
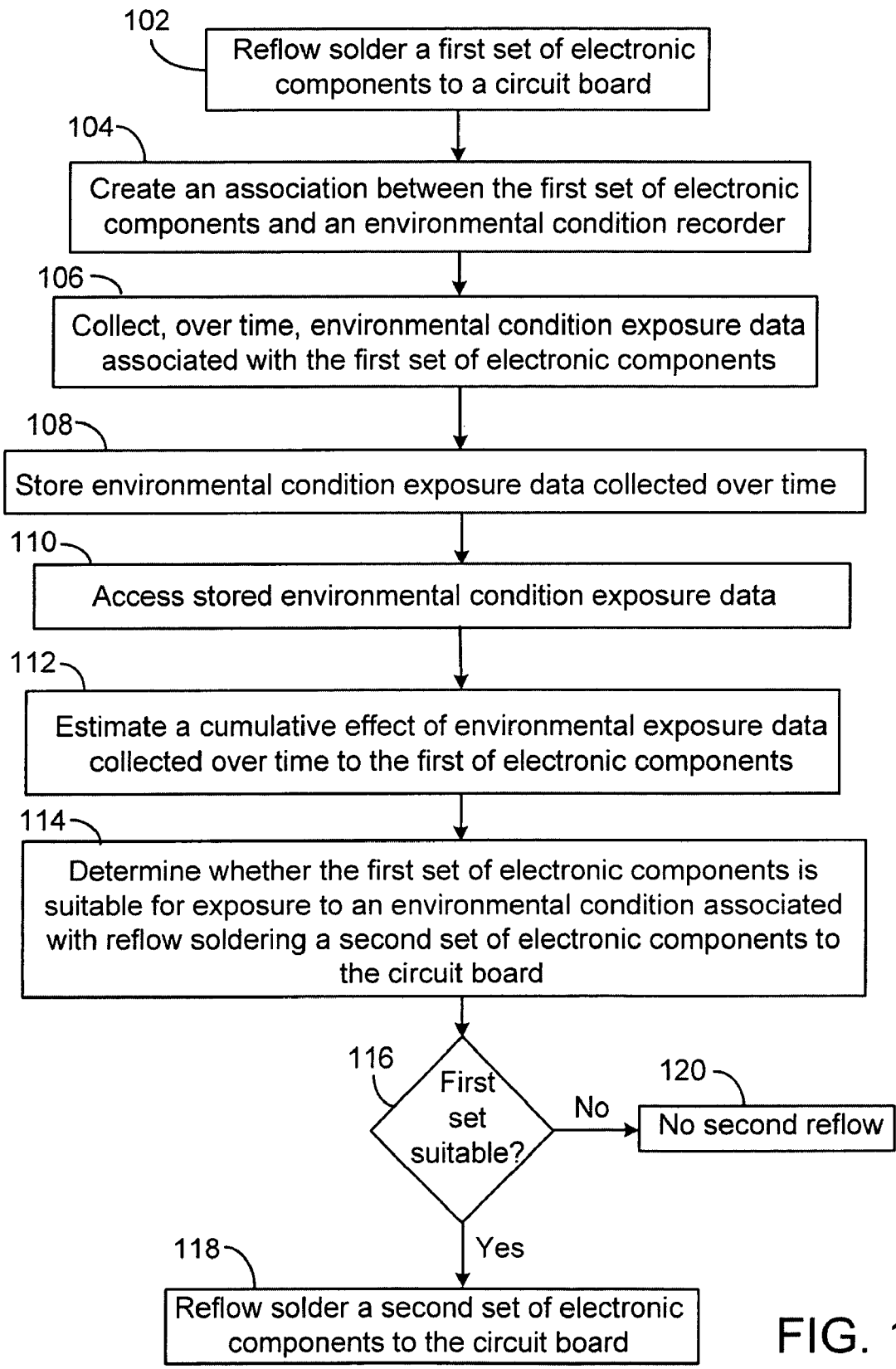
FIG. 1 is a flowchart describing a process for monitoring ambient moisture exposure of a set of electronic components secured to a circuit board.

FIG. 1 is a flowchart detailing an improved method for evaluating whether a set of electronic components secured to a circuit board is suitable for exposure to conditions associated with reflow soldering a second set of electronic components to the same circuit board. This improved method may reduce the likelihood that a component from the first set will be damaged by the expansion of trapped moisture when that set of components is exposed to the conditions associated with reflow soldering the second set of components.

According to the illustrated embodiment, a circuit board manufacturer first reflow solders 102 a first set of electronic components to a circuit board. This first set of electronic components may, in fact, be just a single component; it may be a group of identical components; or, more likely, it may be a group of non-identical components. Typically, the set of electronic components will be surface mount devices (SMDs) and the circuit board will be a printed circuit board, such as are routinely installed in computer equipment and the like. In many instances this first set of electronic components will be positioned in a manner such as to populate only one side of the circuit board, leaving the opposite side available for population by subsequently attached components. Notably, although reflow soldering is specifically identified as the securing method, other securing methods may be utilized as well.

After reflow soldering 102 the first set of electronic components to the circuit board, an association is created 104 between the first set of secured electronic components and an environmental condition recorder. This association may be created, for example, by physically attaching the environmental condition recorder to the circuit board upon which the first set of electronic components has been secured. Alternatively, a logical association may be created between each component of the first set and the environmental condition recorder in a computer database.

According to one embodiment, the environmental condition recorder is a compact device that includes a machine-readable computer chip, an ambient temperature-sensing element and an ambient relative humidity sensing device. These sensing elements are typically responsive in real time. The machine-readable chip includes an integral processor, a memory storage unit and a timing element. The processor is configured to periodically receive data from the sensing elements and to store that data in the memory storage unit. The processor may also, in certain embodiments, evaluate the stored data to determine whether any of the electronic components of that first set of electronic components have, at a given time, been exposed to a sufficient amount of ambient moisture so as to be rendered susceptible to damage if a second set of electronic components were reflow soldered to the same circuit board. This determination would consider the cumulative effect over time of the first set's exposure to ambient moisture (determined by ambient temperature measurements and ambient relative humidity measurements) from the time when the first set of electronic components were attached to the circuit board, to just before the second set of electronic components is to be reflow soldered to the same circuit board.

The computer readable chip is typically capable of communicating with a remote device over a communications channel. Such a remote device could be, for example, a handheld scanner and the communications channel may be, for example, a wireless connection. An exemplary environmental condition recorder that may be used to implement the techniques and methods described herein is Accu-Assembly™ Incorporated's HumiTel™. An another exemplary environmental recorder was described, in general terms, in U.S. patent application, Ser. No. 09/924,279, now U.S. Pat. No. 6,759,862, which was filed on Aug. 8, 2001. That application is hereby incorporated by reference in its entirety.

After creating 104 an association between the first set of components and the environmental condition recorder, the associated environmental condition recorder collects 106, over time, environmental exposure data associated with the first set of electronic components. This collected environmental exposure data may include, for example, ambient temperature measurements, ambient percent relative humidity measurements, as well as other measurements indicative of exposure to ambient moisture content. Generally, this data is automatically, and periodically collected as the processor samples measurements obtained by the environmental sensing elements. It is considered generally desirable that the environmental condition recorder collect environmental exposure data from immediately after the first set of components is reflow soldered to the circuit board until just before the second set of components is reflow soldered to the circuit board.

Typically, as the environmental condition recorder collects 106 environmental condition exposure data, it also electronically stores 108 that collected data in a memory storage device.

At some point prior to reflow soldering the second set of electronic components to the circuit board, the collected environmental condition exposure data is accessed 110 for evaluation. This may be done either by a processing unit inside the environmental condition recorder, or, by an external device, such as a hand held reader configured to access data from the environmental condition recorder's internal memory storage device.

The accessed data is examined to estimate 112 a cumulative effect of the environmental exposure, represented by the accessed data, on the first set of electronic components. This estimation may be accomplished by either the environmental condition recorder's internal processing unit or by an external processing unit. This estimation can be accomplished, for example, by considering the effect of such exposure on each individual electronic component of the first set of components. Additionally, the estimation may reference industry standard guidelines that recommend maximum moisture exposure for particular types of electronic components, for example, IPC/JEDEC J-STD-033A. Also, the estimation may involve estimating the remaining floor life of each component of the first set.

According to the next step of the method, a processor determines 114, based on the estimated cumulative effect, whether the first set of components is suitable for exposure to environmental conditions associated with reflow soldering a second set of electronic components to the circuit board. The environmental conditions associated with reflow soldering the second set of electronic components generally include exposure to elevated temperatures over some period of time. The amplitude of the elevated temperature may depend, for example, on the reflow soldering technique implemented, the proximity of the second set of components to the first set of components, the number of electronic components to be secured in the second set, etc. Each of these factors may weigh into the determination of suitability. It will generally be considered desirable to make this suitability determination as close as possible to the time when the second set of electronic components are reflow soldered to the circuit board.

What happens next, according to the illustrated embodiment, depends upon the outcome of the suitability determination 116. If the first set of electronic components are determined to be suitable for exposure to conditions associated with reflow soldering a second set of components to the same circuit board, then the second set of electronic components will be reflow soldered 118 to the circuit board. If, on the other hand, the first set of electronic components are determined to be not suitable for exposure to conditions associated with reflow soldering a second set of components to the same circuit board, then the second set of electronic components will not 120 be reflow soldered to the circuit board. In that instance, corrective measures, such as baking, may be implemented to rectify any moisture concerns.

Figure 2:
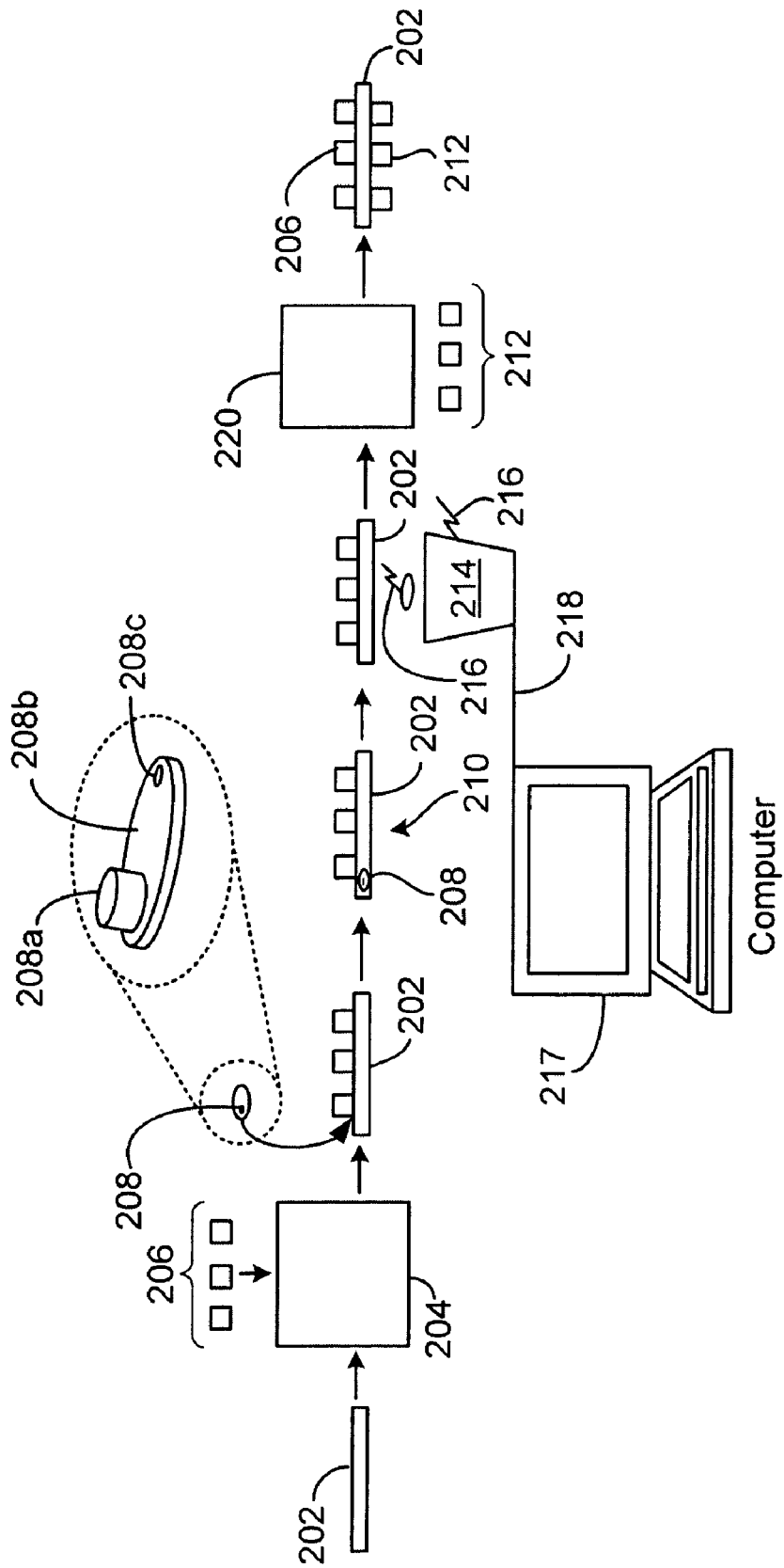
FIG. 2 illustrates a system for assembling circuit boards.

FIG. 2 illustrates a particular embodiment of a system for evaluating whether a set of electronic components secured to a circuit board is suitable for exposure to conditions associated with reflow soldering a second set of electronic components to the same circuit board. As discussed above, the illustrated system may reduce the likelihood that a component of the first set of components, attached to the circuit board, will be damaged by the expansion of moisture trapped inside components of that set when those components are exposed to conditions associated with reflow soldering a second set of components to the same circuit board.

The illustrated embodiment shows a circuit board 202 at various stages of assembly. As depicted, the circuit board 202 first enters a reflow soldering area 204. In the reflow soldering area 204, a first set 206 of electronic components is secured to the circuit board 202. Notably, any number of techniques known in the art may be used to attach the first set 206 of electronic components to the circuit board. The electronic components may be, for example, surface mount devices. Typically, this first set 206 is attached to the circuit board 202 in a manner such that the electronic components of the set 206 populate only one side of the circuit board 202.

Immediately after the first set 206 of electronic components is secured to the circuit board 202 (or shortly thereafter), an environmental condition recorder 208 is attached to the circuit board 202 using a conventional method, such as applying an adhesive material to hold the environmental condition recorder 208 in place. Generally, the environmental condition recorder 208 is attached to the circuit board 202 in a manner that will ensure that it remains with the circuit board until just before a second set of electronic components is reflow soldered to the circuit board. According to the illustrated embodiment, the environmental condition recorder 208 includes a machine-readable computer chip in a stainless steel can 208a attached to a flange member 208b having an aperture 208c.

As indicated by position 210, the environmental condition recorder 208 travels with the circuit board 202 and with the first set of electronic components 206 mounted thereon wherever they may go. The environmental condition recorder 208 periodically and automatically records environmental condition data. After the environmental condition recorder 208 is secured to the circuit board 202, the resulting assembly may be placed, for example, in a dry storage room or some other storage facility for some period of time. The environmental condition recorder 208 continually monitors ambient moisture exposure and automatically records data indicating such exposure while the environmental condition recorder 208 is secured to the circuit board 202.

At some point prior to reflow soldering a second set 212 of electronic components to the circuit board 202, the moisture exposure data that was collected and stored by the environmental condition recorder is accessed. In the illustrated embodiment, this is accomplished by a handheld scanner 214 that is configured to access the stored data over a wireless connection 216 with the environmental condition recorder 208. Data that passes from the environmental condition recorder 208 to the scanner 214 may include, for example, ambient temperature and relative humidity measurements collected over time, other data indicative of exposure to ambient moisture content over time, data indicating the suitability of the components of the first set of components for exposure to conditions associated with a subsequent reflow soldering on the same circuit board, etc. The environmental condition recorder 208 may be detached from the circuit board 202 at this time.

The scanner 214 is connected to a computer 217 over communication channel 218. The computer 217 receives data from the scanner 214 over the communication channel 218. The computer 217 performs further processing of the data and provides a user interface screen where a system operator can visually inspect, for example, moisture exposure data and other system information.

If the first set 206 of electronic components is found suitable for exposure to conditions associated with reflow soldering a second set 212 of electronic components to the same circuit board 202, then the circuit board 202 (with the first set 206 of components attached thereto) is placed in a second reflow soldering area 220. It should be understood, of course, that although two different reflow areas (i.e., 204, 220) are illustrated, the two subsequent reflow soldering processes discussed herein may be performed in the same reflow soldering area at different times.

During the second reflow soldering process, the second set 212 of electronic components are reflow soldered to the circuit board 202. Significantly, as the second set 212 of electronic components are being reflow soldered to the circuit board 202, the components of the first set 206 of electronic components are exposed to an elevated temperature for a period of time.

After the second reflow soldering process is complete, a circuit board 202 emerges from the reflow soldering area 220 having a first and second set (i.e., 206 and 212, respectively) of electronic components secured to it. Because of the methods and techniques described herein, the manufacturer may enjoy a level of comfort believing that first set 206 of electronic components was not damaged during reflow soldering the second set 212 of electronic components to the circuit board 202.

Figure 3:
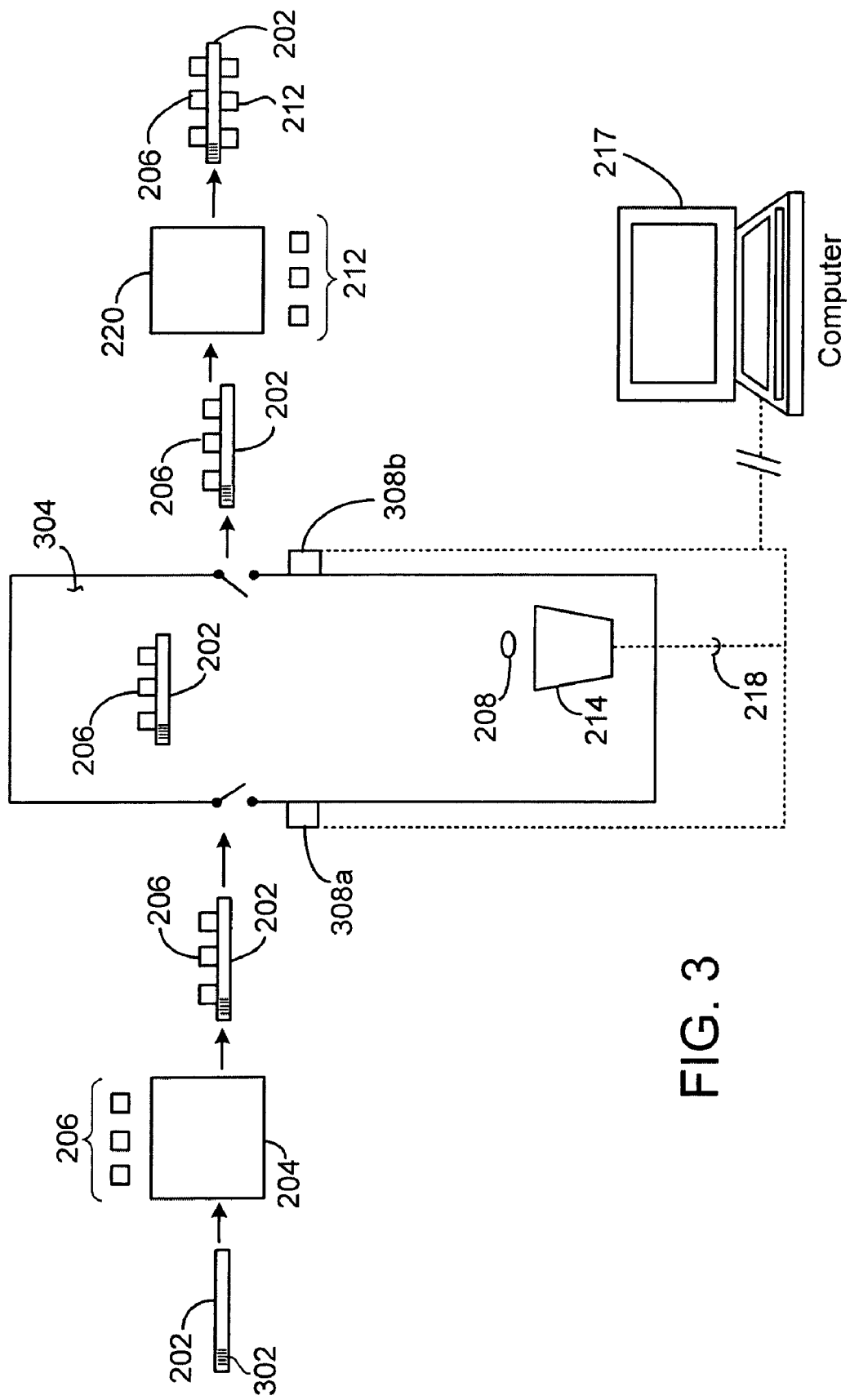
FIG. 3 illustrates an alternate embodiment of a system for assembling circuit boards.

FIG. 3 illustrates an alternate embodiment of a system for evaluating whether a set of electronic components secured to a circuit board is suitable for exposure to conditions associated with reflow soldering a second set of electronic components to the same circuit board. This alternate embodiment illustrates a different method of creating an association between the first set 206 of electronic components and the environmental condition recorder 208. Since many of the elements discussed above area also illustrated here, like reference symbols indicate like elements.

The embodiment of FIG. 3 differs from the embodiment illustrated in FIG. 2 primarily in that a bar code identifier 302 is positioned on the circuit board 202, the environmental condition recorder 208 is securely located within an interim storage area 304, and bar code scanners 308a, 308b are positioned at the entrance and exit of the interim storage area 304. It should be noted that the interim storage area 304 may not be a discrete, enclosed area, but may, instead simply be an area near the first reflow area 204, exposed to ambient, uncontrolled atmospheric conditions.

The bar code identifier 302 will typically include, at least, a unique circuit board identification code and sufficient information to enable identification of each component from the first set 206 of electronic components.

After the circuit board 202 exits the first reflow soldering area 204 with the first set 206 of electronic components secured thereto, the system operator scans the bar code identifier 302 using the bar code scanner 308a and places the circuit board 202 inside the interim storage area 304. It should be understood that the steps of scanning the bar code identifier 302 and placing the circuit board 202 inside the interim storage area could, in some instances, be automated. It is generally considered desirable to place the circuit board 202 inside the interim storage area 304 immediately after (or very shortly thereafter) the circuit board 202 emerges from the reflow soldering area 204.

The bar code scanner 308a sends the data it scans to a computer 217. The computer 217 is configured to maintain a database of information associated with moisture exposure of various circuit boards (and the discrete components secured thereon) stored within the interim storage area. When the computer 217 receives data from the bar code scanner 208a, it updates the database to reflect that a particular circuit board (identified by the unique circuit board identification code included in the bar code identifier 302), having particular components mounted thereon (also identified through information in the bar code identifier 302) entered the interim storage area 304 at a particular time. The computer 217 creates a logical association in its database between the environmental condition recorder 208 that is monitoring conditions within the interim storage area 304, and the circuit board 202 when it is placed within the interim storage area 304.

The environmental condition recorder 208 is located within the interim storage area and is configured to continually monitor and periodically and electronically record ambient moisture conditions inside the interim storage area 304. As discussed in further detail above, the environmental condition recorder 208 can do this by measuring and recording data indicative of ambient temperature and percent ambient relative humidity. In certain embodiments, especially where the interim storage area is very large, it may be desirable to include several environmental condition recorders positioned at various locations within the interim storage area.

A scanner 214 is positioned proximate the environmental condition recorder 208 inside the interim storage area and is configured to periodically extract data from the environmental condition recorder. The scanner 214 passes this extracted data to the computer 217 over communications channel 218 for further processing and user interfacing. An alternate arrangement could include an environmental condition recorder 208 configured to communicate directly with the computer 217, thereby eliminating the need for scanner 214.

The computer 217 will associate, in its database, any moisture exposure data it receives with a particular circuit board 202 (and the first set 206 of components mounted thereon) for as long as that circuit board 202 remains inside the interim storage area 304.

When the system operator is ready to reflow solder a second set 212 of electronic components onto the circuit board 202, he or she will remove the circuit board 202 from the interim storage area 304. As the circuit board 202 is removed from the interim storage area, the bar code identifier 302 is again scanned, this time by bar code scanner 308b. Bar code scanner 308b then sends the scanned data to the computer 217 indicating that the circuit board 202 is being removed from the interim storage area 304. The computer 217 then updates its database to reflect this change.

The computer 217 then estimates a cumulative effect of the ambient moisture that the first set 206 of components was exposed to while inside the interim storage area 304. The computer 217 also determines whether the first set 206 of electronic components is suitable for exposure to conditions associated with reflow soldering a second set 212 of electronic components to the same circuit board 202. The computer 217 may, for example, provide an indication of its determinations to a system operator, or may automatically prevent reflow soldering of the second set 212 of electronic components to the circuit board 202 if its determination is unfavorable.

FIG. 4 is a table excerpted from joint industry standard IPC/JEDEC J-STD-033A, entitled "Handling, Packing Shipping and Use of Moisture/Reflow Sensitive Surface Mount Devices" (April 1999). This table provides useful reference information for estimating a cumulative effect of the environmental exposure over time on the first set of electronic components secured to the circuit board and determining whether that first set of components is suitable for exposure to conditions associated with reflow. The illustrated table lists equivalent derated floor lives for three temperatures, either 20° C., 25° C. or 30° C. and for relative humidity levels ranging from 20%–90% RH. As described below in further detail, reference to such information may provide guidance as to whether a set of electronic components secured to a circuit board are suitable for exposure to conditions associated with reflow soldering a second set of components to the same circuit board.

Figure 5:
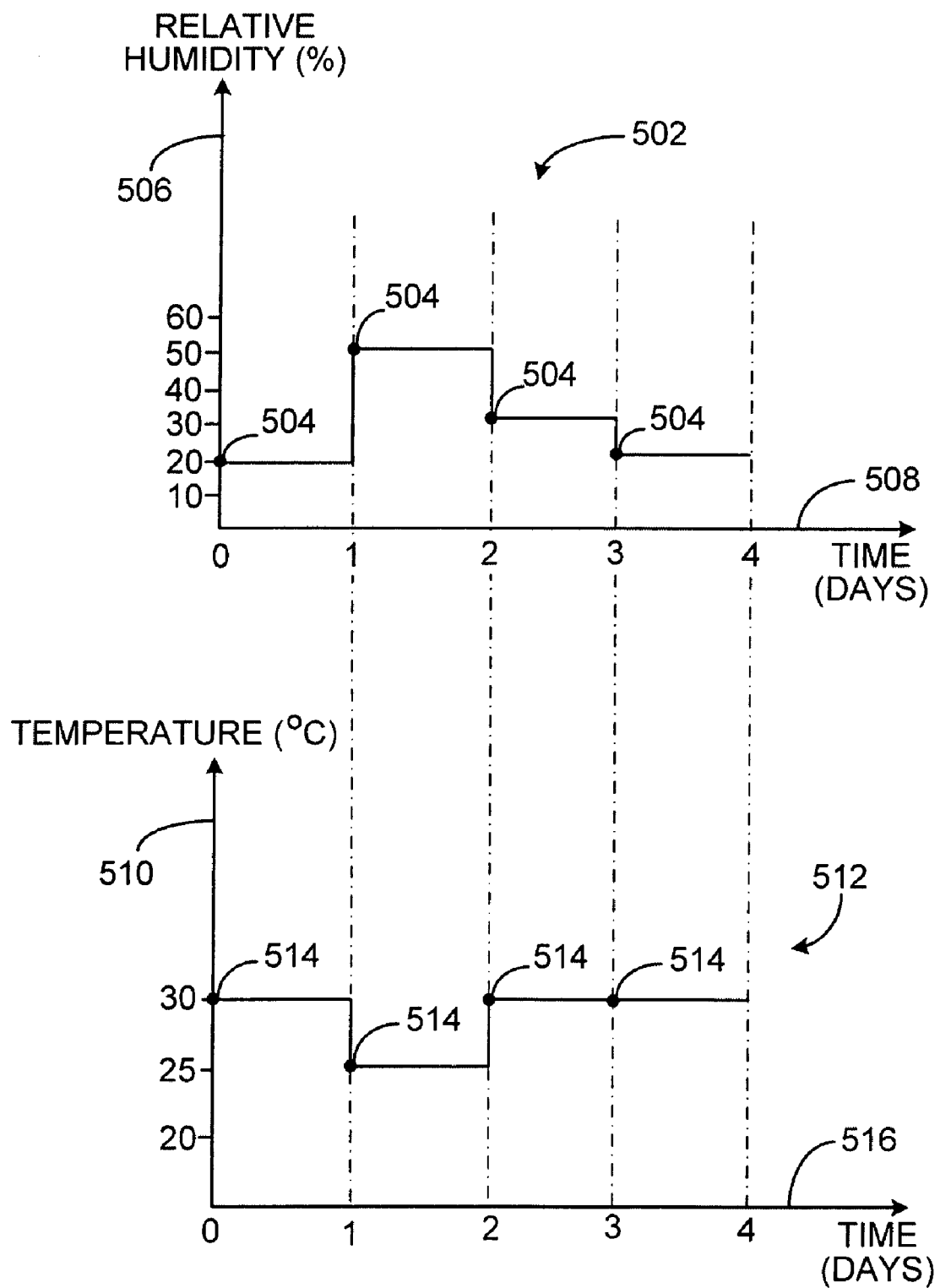
FIG. 5 is a graph indicating an exemplary set of percent relative humidity and temperature measurements as a function of time.

FIG. 5 illustrates, in graphical fashion, the type of data that might be collected by an ambient percent relative humidity sensing device and ambient temperature sensing device of an environmental condition recorder 202, over time. As illustrated, the vertical axis 506 (ordinate) of the upper graph 502 indicates ambient relative humidity, expressed in percentage relative humidity and the horizontal axis 508 (abscissa) represents time, expressed in days. This upper graph 502 provides an indication of the ambient relative humidity that a first set of associated electronic components was exposed to over time. The data points 504 on the graph indicate actual samplings of relative humidity. The graph 502 indicates that relative humidity measurements were sampled one time per day. In order to maximize accuracy of the graphical representation, it may be desirable to reduce the time between data points 504. However, doing so may hasten the depletion of available memory for saving such data.

Referring now to the lower graph 512 of FIG. 5, the vertical axis 510 (ordinate) of the lower graph 512 indicates ambient temperature, expressed in degrees Celsius and the horizontal axis 516 (abscissa), again, represents time, expressed in days. This lower graph 512 provides an indication of the ambient temperature exposure of the first set of associated electronic components over time. The data points 514 represent actual samplings of ambient temperature at particular times.

Notably, the time axis 516 of the lower graph 512 corresponds directly to the time axis 508 of the upper graph 502. So, it is possible to determine both the ambient relative humidity and the ambient temperature at each sampling time along the time axes. This relative humidity data and temperature data can be used to determine the amount of ambient moisture near the set of components at any given sampling time.

Figure 6:
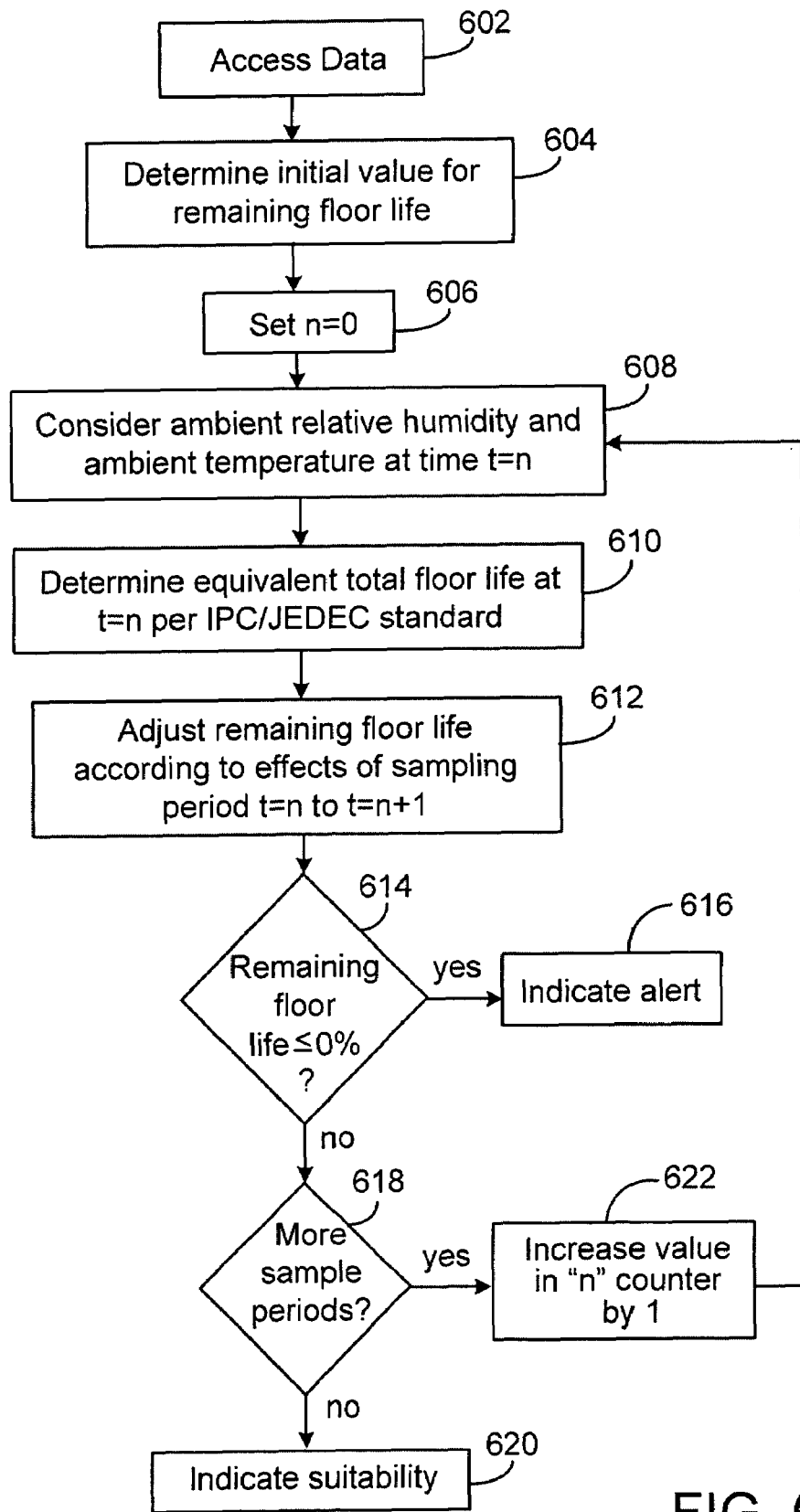
FIG. 6 is a flowchart detailing a method of evaluating a set of moisture exposure data points.

FIG. 6 details a particular method that may be used to estimate 112 the cumulative effect of exposure to ambient moisture content on a first set (e.g., 206) of electronic components secured to a circuit board (e.g., 202) and to determine 114 whether that set 206 is suitable for exposure to conditions associated with reflow soldering a second set (e.g., 212) of electronic components to the same circuit board. Generally, the method includes calculating an expected floor life associated with each component on the circuit board at discrete times based on environmental conditions at those times. Once the expected floor life at a given time is determined, the actual expected floor life remaining for that particular component can be reduced an appropriate amount depending on approximately how long the component was exposed to those conditions. According to the illustrated method, if the actual floor life remaining reaches 0% for any component, then the entire set is deemed unsuitable for exposure to reflow soldering conditions, and remedial measures, such as baking, would likely be taken. This method may be accomplished by any processing unit, for example, a processing unit located inside an environmental condition recorder 202 or a processing unit located inside some remote computer (e.g., 217).

If a particular installation includes multiple electronic components attached to a circuit board, it may be necessary to repeat the illustrated process for each component individually until, for example, one component is found unsuitable. In order to ensure clarity, the following description is limited to a circuit board with just one electronic component secured to it. However, one of skill in the art will readily understand how the techniques below can be adopted to installations having multiple electronic components secured to a circuit board.

According to the illustrated method, the processing unit accesses 602 data, representing, among other things, the extent of exposure to ambient moisture content that a set of electronic components has endured over time. According to one embodiment, the accessed data will include a series of ambient relative humidity and ambient temperature data points collected over time (similar to the information illustrated in FIG. 5), a unique identification code for the set of electronic components under scrutiny, and data sufficiently detailed to enable identification of each electronic component of the set. Various other types of data may be accessed according to the particularities of different embodiments. This will, of course, be understood by one of skill in the art.

After accessing the data, the processing unit determines 604 an initial value for remaining floor life of each electronic component of the set. This initial value represents what the expected floor life of each component was when the first set of data points was collected (e.g., referencing FIG. 5, the first set of data points was collected at time=0 days). According to one implementation, remaining floor life estimation will have been calculated prior to reflow soldering the first set of electronic components to the circuit board (and therefore, prior to time=0 days in FIG. 5). The result of this prior calculation will have been saved in a database. In such a case, the initial value may simply be retrieved from the database.

According to the illustrated embodiment, the processing unit then initializes 606 a counter (represented as "n") by storing a numerical value "0" therein. Typically, the counter will be a simple electronic counter as is known in the art.

Next, the processing unit considers 608 the first set of data points. As an example, cross referencing to FIG. 5, the first set of data points represents percent relative humidity and temperature at time=0 days. In this example, those values would be 20% and 30° C., respectively.

The processor then determines 610 an equivalent derated floor life for the electronic component at time=0 days by referencing, for example, information from the IPC/JEDEC table of FIG. 4. For illustrative purposes, we can assume that the electronic component in question has a body thickness of $\geq 3.1$ mm, and that it has a moisture sensitivity level of 3. Since the first set of data points indicate a relative humidity of 20% and a temperature of 30° C., then, according to FIG. 4, the equivalent total floor life expected for that component, under those conditions will be 10 days.

Next, the processor adjusts 612 the remaining floor life value for the electronic component according to the effect of one sampling period. This may be done in a number of ways. According to one embodiment, the processor will first review the moisture exposure data to identify how much time had passed between data point samplings. Referring for illustrative purposes again to FIG. 5, the period between data point samplings was 1 day. The processor then determines how long the electronic component had been exposed to those particular ambient moisture conditions and expresses that length of time as a percentage of equivalent total floor life (per IPC/JEDEC standards, for example). This determination requires an assumption about how the ambient moisture may have varied throughout the day. Depending on the particular embodiment, any number of possible assumptions may be appropriate. One approach is to assume that the ambient moisture level remained constant over the course of that day, at the same level as indicated by the first data point. Using that approach in this example, the electronic component was, presumably, exposed to 20% relative humidity and a temperature of 30° C. for 1 day. This 1-day translates to 10% of its equivalent total floor life (1 day/10 days× 100=10%). Assuming that the initial value for remaining floor life at time=0 days was 100%, the processor would conclude that the remaining floor life should be adjusted to indicate that, at time "t"=1 day, the remaining floor life was 90% (100%×0.9=90%).

After adjusting 612 the remaining floor life of the electronic component, the processor inquires 614 whether the remaining floor life is $\leq 0\%$. If the remaining floor life is $\leq 0\%$, then the processor will indicate 616 an alert of sorts. According to one embodiment, the alert is an audio/visual alarm, which urges the system operator to take remedial measure (e.g., baking the circuit board and suspect component prior to reflow soldering other components to the circuit board). According to another embodiment, the alert is embodied by a system shutdown sequence, which simply prevents the circuit board, upon which the suspect electronic component is mounted, from being subjected to conditions associated with reflow soldering other components to the same board.

If the processor determines 614 that the remaining floor life is not $\leq 0\%$, then the processor reviews the moisture exposure data to determine 618 whether any more data point sample periods exist that have not been considered yet. If all data point sample periods have been considered, then the processor will indicate 620 suitability of the electronic components for exposure to conditions associated with reflow soldering additional components to the same circuit board.

If, however, data points exist that have not yet been considered, the processor will increase 622 the value stored in the "n" counter by 1, and then, consider 608 the ambient relative humidity and ambient temperature data point indicating those variables at time=1day. These data points are evaluated and treated in a manner that is similar to the manner discussed above related to the data points at time=0 day.

Generally, any remaining data points are treated as described above until all data periods have been considered or until the remaining floor life reaches a value of 0% or below.

A number of implementations of the invention have been described. Nevertheless, it will be understood that various modifications may be made without departing from the spirit and scope of the invention. For example, other industry standard or non-standard guidelines for estimating remaining floor life may be referenced to estimate the cumulative effect of environmental exposure on a set of electronic components. Other technologies may be used instead of the barcode technology described herein, such as radio frequency ("RF") based technology. Additionally, the techniques described herein may be applied to other situations where an electronic device secured to a circuit board may come into contact with elevated temperatures. Also, various modifications to the details of the exemplary remaining life calculations presented herein will be apparent to one of skill in the art. Accordingly, other implementations are within the scope of the following claims.

What is claimed is:

1. A method of assembling multiple electronic components to a circuit board, the method comprising:
   securing an electronic component to the circuit board;
   creating an association between the secured electronic component and an environmental condition recorder;
   recording data from the environmental condition recorder, the data indicating exposure of the secured electronic component to an environmental condition over time; and
   determining, based on the recorded data, whether the secured electronic component is suitable for exposure to conditions associated with securing a second electronic component to the circuit board.

2. The method of claim 1 further comprising, if the secured electronic component is found suitable, exposing the suitable secured electronic component to conditions associated with securing said second electronic component to the circuit board.

3. The method of claim 1 further comprising maintaining the association between the secured electronic component and the environmental condition recorder from shortly after securing the electronic component until determining suitability.

4. The method of claim 1 wherein the environmental condition recorder is adapted to continually monitor and periodically record an ambient environmental condition.

5. The method of claim 1 wherein the environmental condition recorder is adapted to automatically record an ambient environmental condition over time.

6. The method of claim 1 wherein the conditions associated with securing said second electronic component to the circuit board comprise exposing the secured electronic component to conditions associated with reflow soldering the second component to the circuit board.

7. The method of claim 1 wherein the conditions associated with securing the second electronic component to the circuit board comprises exposing the secured electronic component to an elevated temperature.

8. The method of claim 1 wherein recording the data from the environmental condition recorder comprises storing data that is indicative of the secured electronic component's exposure to atmospheric moisture content.

9. The method of claim 8 wherein the data indicative of atmospheric moisture content comprises temperature measurements and percent relative humidity measurements collected by the environmental condition recorder over time.

10. The method of claim 1 wherein creating the association between the secured electronic component and the environmental condition recorder comprises physically attaching the environmental condition recorder to the circuit board.

11. The method of claim 1 wherein creating the association between the secured electronic component and the environmental condition recorder comprises creating a logical association between the secured electronic component and the environmental condition recorder in a computer database.

12. The method of claim 1 wherein an identification code is positioned on the circuit board, the identification code providing sufficient information to enable identification of the secured component and the circuit board and wherein creating the association comprises logically linking, in a computer database, the secured electronic component and the circuit board, based on information provided by scanning the identification code.

13. The method of claim 12 wherein the identification code positioned on the circuit board is based on bar code technology.

14. The method of claim 12 wherein the identification code is based on radio frequency technology.

15. The method of claim 1 wherein recording the data from the environmental condition recorder comprises recording the data to a memory storage unit within the environmental recorder.

16. The method of claim 15 further comprising accessing the recorded data from the memory storage unit, for the suitability determination over a communication channel.

17. The method of claim 1 wherein recording data from the environmental condition recorder comprises recording data to a memory storage unit that is located external to the environmental condition recorder.

18. The method of claim 1 further comprising estimating a cumulative effect that exposure to the recorded environmental conditions would have on the secured component.

19. The method of claim 18 wherein estimating the cumulative effect that exposure to the recorded environmental conditions would have approximates integrating effects of exposure to the recorded environmental conditions over time.

20. The method of claim 18 wherein estimating the cumulative effect that exposure to the recorded environmental conditions would have comprises referencing industry standard guidelines related to expected total floor life for the secured electronic component under particular environmental conditions.

21. The method of claim 1 wherein the environmental condition recorder comprises:
   a sensing element responsive to an environmental condition;
   a memory storage unit in electronic communication with the sensing element and adapted to store environmental condition data sensed by the sensing element; and
   a processing unit in electronic communication with the sensing element and the memory storage unit.

22. The method of claim 21 wherein the processing unit is adapted to record the data from the environmental condition recorder by periodically sampling the sensing element and electronically storing the sample in the memory storage unit.

23. The method of claim 22 wherein the processing unit is adapted to determine whether the secured component is suitable for exposure to conditions associated with securing said second electronic component to the circuit board by evaluating the sample, stored in the memory storage unit.

24. A method of securing multiple sets of electronic components to a circuit board, the method comprising:
reflow soldering a first set of electronic components to said circuit board;
subsequently, creating an association between the first set of electronic components and an environmental condition recorder;
collecting environmental exposure data with the environmental condition recorder, the environmental exposure data being associated with the first set of electronic components during consecutive time periods before reflow soldering a second set of electronic components to the circuit board;
storing the collected data in the environmental condition recorder;
estimating, with the environmental condition recorder, a cumulative effect of the environmental exposure on each electronic component of the first set, based on the stored data; and
evaluating, with the environmental condition recorder, whether each electronic component of the first set is suitable for exposure to environmental conditions associated with reflow soldering the second set of electronic components to the circuit board.

25. The method of claim 24 further comprising reflow soldering the second set of electronic components to the circuit board depending on whether each electronic component of the first set is suitable for exposure to environmental conditions associated with reflow soldering the second set of electronic components to the circuit board.

26. The method of claim 24 wherein the conditions associated with reflow soldering said second set of electronic components to the circuit board comprise an elevated temperature.

27. The method of claim 24 wherein collecting environmental exposure data comprises collecting temperature measurements and relative humidity measurements.

28. The method of claim 24 creating the association comprises attaching the environmental condition recorder to the circuit board.

29. The method of claim 24 wherein creating the association comprises scanning a bar code affixed to the circuit board, the bar code identifying each electronic component of the first set of components secured to the circuit board.

30. The method of claim 24 wherein storing the collected data comprises storing the collected data in a memory storage unit within the environmental condition recorder.

31. The method of claim 24 wherein the collected data comprises temperature measurements and relative humidity measurements collected over time and wherein estimating the cumulative effect of the environmental exposure comprises integrating the temperature measurements and relative humidity measurements with respect to time.

32. The method of claim 24 wherein evaluating whether each electronic component of the first set is suitable for exposure to environmental conditions associated with reflow soldering the second set of electronic components to the circuit board comprises referencing industry standard guidelines.

33. The method of claim 24 wherein collecting the environmental exposure data associated with the first set of electronic components comprises using an environmental condition recorder to continually monitor and periodically and electronically record an environmental condition.

34. The method of claim 24 wherein collecting the environmental exposure data associated with the first set of electronic components comprises using said environmental condition recorder to automatically record environmental condition data.

35. The method of claim 24 wherein the environmental condition recorder comprises:
a sensing element responsive to an environmental condition;
a memory storage unit in electronic communication with the sensing element and adapted to store environmental condition data sensed by the sensing element; and
a processing unit in electronic communication with the sensing element and the memory storage unit.

36. The method of claim 35 wherein the processing unit is adapted to collect environmental condition exposure data by periodically sampling the sensing element and electronically storing the sample in the memory storage unit.

37. The method of claim 35 wherein the processing unit is adapted to evaluate whether each electronic component of the first set is suitable for exposure to conditions associated with securing a second electronic component to the circuit board by evaluating the sample, stored in the memory storage unit.

* * * * *